(12) United States Patent
Nakamura et al.

(10) Patent No.: US 10,641,798 B2
(45) Date of Patent: May 5, 2020

(54) CURRENT DETECTION DEVICE HAVING A FIXING PORTION FORMED IN A WIRING MEMBER

(71) Applicant: KOA CORPORATION, Ina-shi, Nagano (JP)

(72) Inventors: Keishi Nakamura, Ina (JP); Koichi Minowa, Ina (JP)

(73) Assignee: KOA CORPORATION, Ina-shi (JP)

( * ) Notice: Subject to any disclaimer, the term of this patent is extended or adjusted under 35 U.S.C. 154(b) by 73 days.

(21) Appl. No.: 15/568,910

(22) PCT Filed: Apr. 21, 2016

(86) PCT No.: PCT/JP2016/062600
§ 371 (c)(1),
(2) Date: Oct. 24, 2017

(87) PCT Pub. No.: WO2016/175116
PCT Pub. Date: Nov. 3, 2016

(65) Prior Publication Data
US 2018/0120359 A1 May 3, 2018

(30) Foreign Application Priority Data

Apr. 28, 2015 (JP) .................................. 2015-091428

(51) Int. Cl.
*G01R 1/20* (2006.01)
*G01R 19/00* (2006.01)
(Continued)

(52) U.S. Cl.
CPC ......... *G01R 19/0092* (2013.01); *G01R 1/203* (2013.01); *H01C 1/14* (2013.01); *H01R 4/34* (2013.01); *H01C 13/00* (2013.01)

(58) Field of Classification Search
CPC ...... G01R 15/14; G01R 15/146; G01R 1/203; G01R 19/0084; G01R 19/0092; H01C 1/14; H01C 1/148; H01C 3/00; H01C 3/02
See application file for complete search history.

(56) References Cited

U.S. PATENT DOCUMENTS

| 1,046,465 | A | * | 12/1912 | Hoyt | ...................... | H01R 31/08 |
| | | | | | | 324/126 |
| 2,708,701 | A | * | 5/1955 | Viola | ...................... | G01R 1/203 |
| | | | | | | 324/126 |
| 4,211,934 | A | | 7/1980 | Henle et al. | | |
| 10,161,968 | B2 | * | 12/2018 | Nakamura | ........... | G01R 15/146 |
| 2008/0030208 | A1 | * | 2/2008 | Aratani | ................ | G01R 1/203 |
| | | | | | | 324/713 |

(Continued)

FOREIGN PATENT DOCUMENTS

| CN | 1545106 A | 11/2004 |
| GB | 2 441 211 A | 2/2008 |

(Continued)

OTHER PUBLICATIONS

International Search Report dated Jul. 19, 2016, issued in counterpart of International Application No. PCT/JP2016/062600 (4 pages) w/English Translation.

*Primary Examiner* — Minh N Tang
(74) *Attorney, Agent, or Firm* — Westerman, Hattori, Daniels & Adrian, LLP

(57) ABSTRACT

Provided is a current detection device that enables to eliminate the influence of vibration that is applied to a bus bar, which is configured as a shunt resistor and measures current with high accuracy and high reliability. The current detection device is provided with a first wiring member and a second wiring member consisting of a conductive metal material, and a resistor body consisting of a metal material having a lower temperature coefficient of resistance than (Continued)

those wiring members and is joined between the first wiring member and the second wiring member, wherein a connection portion for making a connection to another wiring member or device is formed at an end of the first wiring member and second wiring member, the end being an opposite side from a joint with the resistor body, and a fixing member is provided between the connection portion and the joint with the resistor body.

3 Claims, 3 Drawing Sheets

(51) Int. Cl.
*H01C 1/14* (2006.01)
*H01R 4/34* (2006.01)
*H01C 13/00* (2006.01)

(56) References Cited

U.S. PATENT DOCUMENTS

| 2008/0050985 A1 | 2/2008 | Roset et al. | |
|---|---|---|---|
| 2012/0229247 A1* | 9/2012 | Yoshioka | G01R 1/203 338/49 |
| 2013/0069632 A1* | 3/2013 | Wagoner | G01R 1/203 324/126 |

FOREIGN PATENT DOCUMENTS

| JP | 63-116980 U | 7/1988 |
|---|---|---|
| JP | 2008-39571 A | 2/2008 |
| JP | 2009-266977 A | 11/2009 |
| JP | 2011-3694 A | 1/2011 |
| JP | 2011-18759 A | 1/2011 |
| JP | 2014-110159 A | 6/2014 |

* cited by examiner

[FIG. 1]
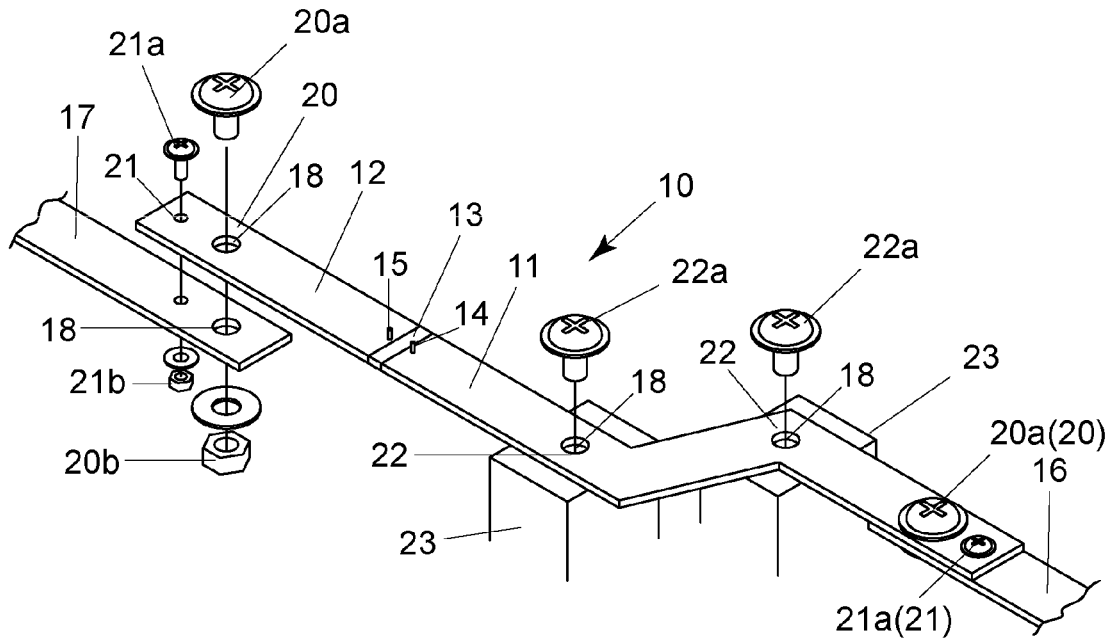
[FIG. 2]
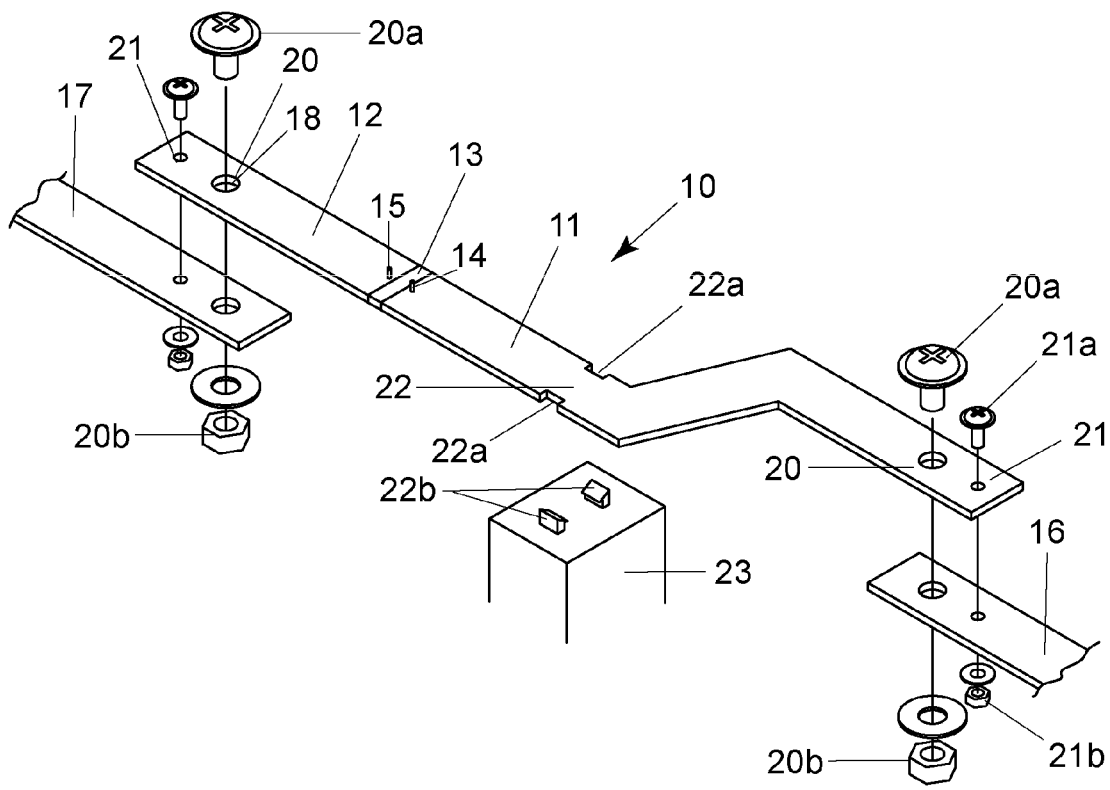

[FIG. 3]
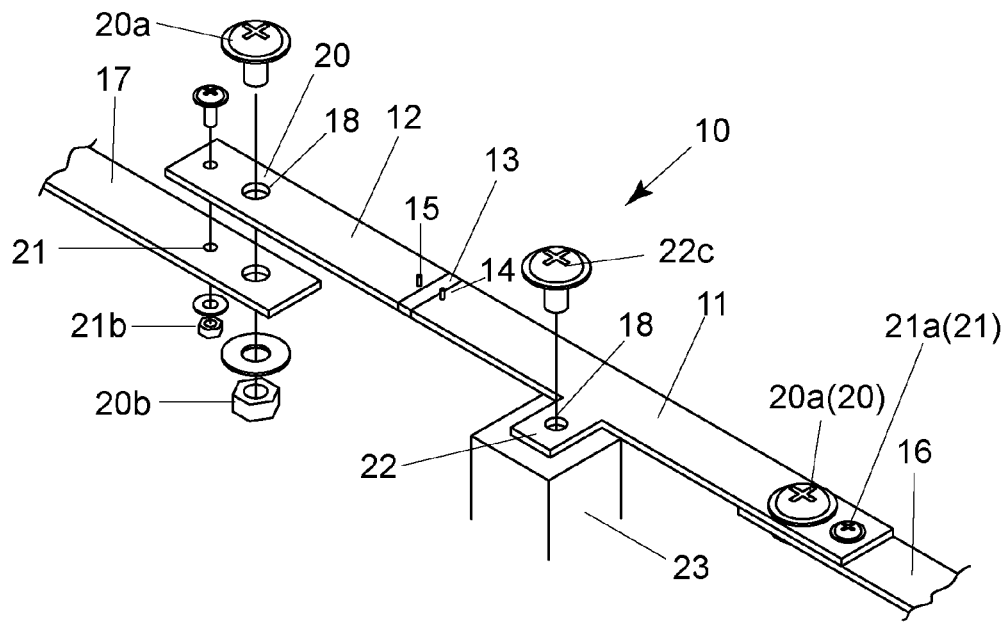
[FIG. 4]
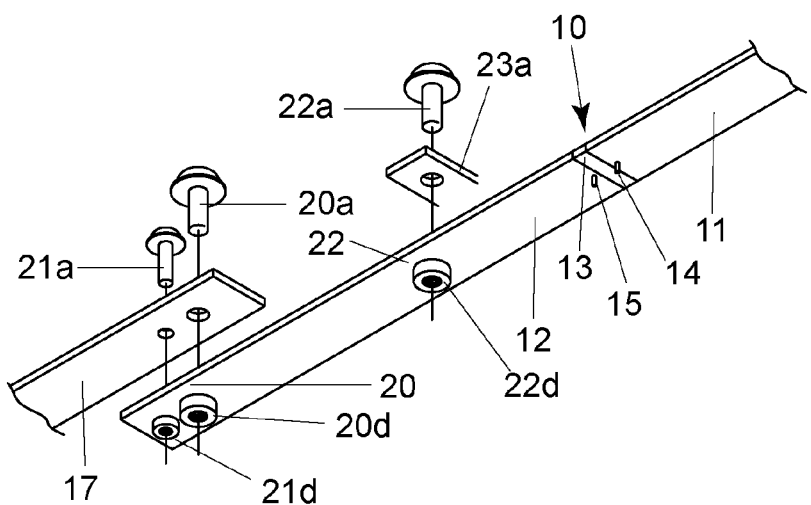

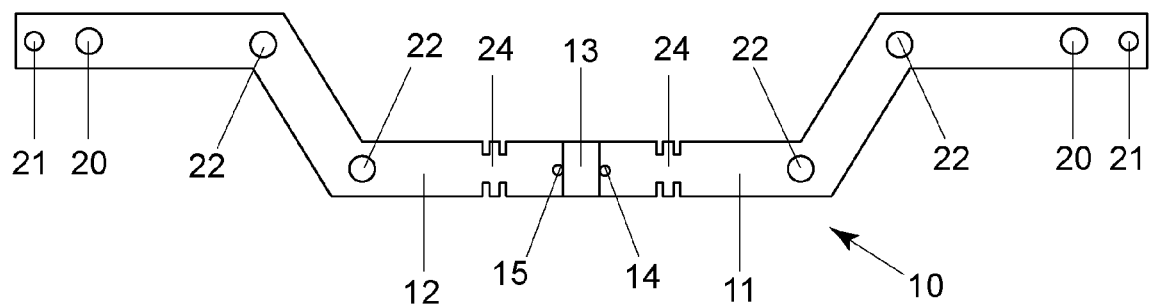
[FIG. 5]

CURRENT DETECTION DEVICE HAVING A FIXING PORTION FORMED IN A WIRING MEMBER

TECHNICAL FIELD

The present invention relates to a current detection device for measuring current flowing through a bus bar etc., especially relating to a shunt type current detection device, which is able to measure current with high accuracy as a shunt resistor, while using the bus bar as current wirings of the shunt resistor.

BACKGROUND ART

The current is conventionally detected by using a shunt resistor, which measures a voltage caused by the current flowing through the shunt resistor in various kinds of current detections. The detections include, detection of electrical charge and discharge current in a battery, detection of motor current that drives an electric vehicle or a hybrid-power car etc., detection of current in electric equipment such as air conditioner, and detection of current in power generating machines including solar battery etc.

In case of a bus bar used as a current path from power supply such as batteries to various electrical equipment, the shunt resistor for current detection must be connected with the bus bar. In such a case, the bus bar and the shunt resistor are conventionally connected with screw fastening or soldering for fixing a terminal or an electrode of the shunt resistor and a terminal of the bus bar (see Japanese laid open patent publication 2011-003694).

However, according to such connection between the bus bar and the shunt resistor, because of increase of connection point, heat generation occurs by contact resistance of the connection between them, and problem of securing connection reliability occurs. Then, a current detection device that can be used for detecting a large current with high reliability is required. Japanese laid open patent publication 2008-039571 discloses a bus bar type shunt resistor, which includes a first wiring member, a second wiring member, and a resistor body welded and fixed between the first and the second wiring members (see FIG. 6 etc.).

SUMMARY OF INVENTION

Technical Problem

However, since the bus bar configured as a shunt resistor is generally long size, then there is a possibility to generate vibration. When vibration is caused by, for example, an engine or others in the bus bar type shunt resistor and both ends being fixed, since the resistor body is joined with wiring members, the vibration is transmitted to the joint, and the vibration influences the joint. Thus, there is a possibility that detection error is caused by the vibration in the bus bar type current detection device.

The invention has been made basing on above-mentioned circumstances. Thus, an object of the invention is to provide a bus bar type current detection device, which makes it possible to eliminate an influence of vibration that is applied thereto, and to measure a current with high accuracy and high reliability.

Solution to Problem

The current detection device of the invention includes a first wiring member and a second wiring member those consisting of a conductive metal material; a resistor body consisting of a metal material having a lower temperature coefficient of resistance than those wiring members, and the resistor body joined between the first wiring member and the second wiring member; connection portions for making a connection to another wiring member or device formed respectively in the first wiring member and in the second wiring member; and a fixing member formed between any one of connection portions formed in the first and second wiring members and the joint with the resistor body.

BRIEF DESCRIPTION OF DRAWINGS

FIG. 1 is an exploded perspective view of the current detection device of embodiment 1 of the invention.

FIG. 2 is an exploded perspective view of the current detection device of embodiment 2 of the invention.

FIG. 3 is an exploded perspective view of the current detection device of embodiment 3 of the invention.

FIG. 4 is an exploded perspective view of the current detection device of embodiment 4 of the invention.

FIG. 5 is a plan view of the current detection device of embodiment 5 of the invention.

DESCRIPTION OF EMBODIMENTS

Embodiments of the present invention will be described below with referring to FIG. 1 through FIG. 5. Like or corresponding parts or elements will be denoted and explained by same reference characters throughout views.

FIG. 1 illustrates the current detection device of embodiment 1 of the invention. A resistor body 13 is welded between bus bars, that is, first wiring member 11 and second wiring member 12. First wiring member 11 is longer than second wiring member 12. The current detection device 10 is configured so that resistor body 13 is joined between a bus bar of wiring member 11 and a bus bar of wiring member 12. As a whole, the device 10 can measure a current as a shunt resistor, and has a function of bus bar at the same time. Both of wiring members 11,12 or either one of wiring members 11,12 is longer size, so the current detection device 10 is longer than usual shunt resistors.

The first wiring member 11 and the second wiring member 12 consist of strip-shaped or rod-shaped highly conductive metal material, such as Cu, Cu system alloy, or Al etc. The resistor body 13 consists of metal resistor alloy material such as Cu—Mn system alloy, Cu—Ni system alloy, or Ni—Cr system alloy, which has much lower temperature coefficient of resistance than metal material such as Cu etc. Both end faces of resistor body 13 are abutted and welded onto end faces of wiring member 11 and wiring member 12, where the joint between resistor body 13 and terminal members 11,12 is formed. Electron beam welding, laser beam welding, brazing and soldering, etc. can be used for the welding. An end portion of resistor body and an end portion of wiring member may be overlapped and pressure-welded to form the joint.

Voltage detection terminals 14,15 are provided on wiring members 11,12 at vicinity of resistor body 13. The current flowing through wiring members 11,12 passes through resistor body 13 and generates a voltage difference between both ends of the resistor body. The voltage difference is detected by voltage detection terminals 14,15.

The wiring member carries out the function of electrode (terminal) of shunt resistor while carrying out the function of bus bar, then, bus bar function and shunt resistor function is combined. Then, connection part where a large current flows becomes unnecessary, and number of parts can be decreased. And, it becomes possible to measure a current flowing through a bus bar with high accuracy and high reliability.

The connection portion 20 is provided at both ends of wiring members 11,12 of both sides of resistor body 13. According to connection portion 20, by using through hole 18 and screw fastening with bolt 20a and nut 20b etc., the current detection device 10 configured as a shunt resistor can be connected to another bus bar etc. such as wiring members 16,17, battery terminals, and equipment such as a motor etc. Further, connection portion 20 may be formed by welding etc.

The positioning portion 21 is provided near the connection portion 20. According to positioning portion 21, by inserting bolt 21a into through holes in wiring members 12 and 17, screw fastening bolt 21a with nut 21b, through holes of wiring members 12,17 are positioned. When forming a connection of wiring members 12 and 17 by inserting bolt 20a into through holes 18 and screw fastening with nut 20b, rotation of one wiring member to another wiring member is stopped, then wiring members 12 and 17 are exactly positioned on the same line, screw fastened with bolt 20a and nut 20b, and connected.

The wiring member 11 is longer than the wiring member 12. A fixing member 22 for fixing the current detection device 10, which is configured as a shunt resistor, onto a housing 23 etc. is provided between the connection portion 20 formed in the current detection device 10 and the joint with resistor body 13. The fixing member 22 fixes long size first wiring member 11 onto fixing portion 23 of a housing etc. by screw fastening etc. at intermediate position (two bent portion in FIG. 1) between connection portion 20 and joint with resistor body 13.

The fixing member 22 is preferably formed nearer to the joint with the resistor body 13 than intermediate between the connection portion 20 and the joint with the resistor body 13. In the embodiment 1, there are two fixing members 22. One of two fixing members 22, which is nearer to the joint with the resistor body 13, is corresponding to above mentioned preferable position. As a result, the influence of the vibration to the joint with the resistor body 13 can be excluded better. For example, in case of the connecting portion 20 connected to equipment such as a motor, by forming fixing member 20 nearer to the joint with the resistor body 13 than intermediate between the connection portion 20 and the joint with the resistor body 13, the influence of the vibration by the motor etc. can be excluded more easily.

In the current detection device 10 that resistor body 13 is joined between wiring members 11,12 to have a bus bar function as a whole, an end face of wiring members (electrodes) and an end face of resistor body is abutted and welded, and the joint is formed by welding. In case of abutted welding, the joint is small in area, and strength of the joint is insufficient. If the fixing member 22 is not provided, when long current detection device 10, in which connection portions 20 are fixed at both ends, vibrates, then the joint is influenced by the vibration, and compression force and tensile force are applied to the joint. Then, there is a possibility that error voltage can be caused.

The current detection device of embodiment 1 is provided with two fixing members 22, which fixes intermediate position of first wiring member 11 onto fixing portion 23 of housing etc. to be mounted (at two bent portions in FIG. 1). The wiring member 11 is fixed by screw fastening with bolt 22a etc. Therefore, even if vibration occurs in the current detection device 10, which is fixed at both ends and configured as a shunt resistor, the vibration is stopped by the fixing members 22 formed in the current detection device 10, and the joint is prevented from being applied with compression force and tensile force according to the vibration. Then, generation of error voltage can be prevented, and the current can be measured with high accuracy and high reliability.

FIG. 2 illustrates the current detection device of embodiment 2. In the embodiment, the fixing member 22 is provided between a connection portion 20 formed at an end of current detection device 10 configured as a shunt resistor and a joint with the resistor body 13 as well as first embodiment. However, in the embodiment, a recess 22a is formed in first wiring member 11a, the recess 22a is fitted into locking member 22b formed on fixing portion 23, and then fixing member 22 is formed. Thereby, generation of error voltage is prevented, and current can be measured with high accuracy and high reliability, as well as embodiment 1.

FIG. 3 illustrates the current detection device of embodiment 3. In the embodiment, the fixing member 22 is provided between a connection portion 20 formed at an end of current detection device 10 configured as a shunt resistor and a joint with the resistor body 13, as well as embodiment 1,2. However, in the embodiment, fixing member 22 that is a part of wiring member 11 projecting horizontally therefrom is formed, and fixing member 22 is fixed on fixing portion 23 with bolt 22c etc. Then, generation of error voltage is prevented, and current can be measured with high accuracy and high reliability, as well as above embodiments.

FIG. 4 illustrates the current detection device of embodiment 4. In the embodiment, the fixing member 22 is provided between a connection portion 20 formed at an end of current detection device 10 configured as a shunt resistor and a joint with the resistor body 13 as well as above embodiments. However, in the embodiment, wiring member 12 is provided with a through hole, nut 22d is fixed to the through hole by welding or pressure fitting, and the fixing member 22 is formed by disposing fixing portion 23a of a part of housing on wiring member 12 and screw fastening them with bolt 22a and nut 22d.

By nut 22d being fixed on wiring member 12 beforehand, the wiring member 12 can be easily fixed on fixing portion 23a. Then, generation of error voltage is prevented, and current can be measured with high accuracy and high reliability, as well as above embodiments.

FIG. 5 illustrates the current detection device of embodiment 5. In the embodiment, the fixing member 22 is provided between a connection portion 20 formed at an end of current detection device 10 configured as a shunt resistor and a joint with the resistor body 13, as well as above embodiments. However, in the embodiment, a pair of fixing members 22 each separated a distance to a joint with resistor body 13 is symmetrically disposed in the current detection device. A pair of narrow width portions 24, which is a stress relaxation area, is symmetrically disposed, where each narrow width portion is disposed between the fixing member 22 and the joint with resistor body 13.

The narrow width portion 24 is a stress relaxation area, where cuts are formed from both sides of the wiring member so as to make the width substantially narrower, and to make the wiring member easy to be bent. As a result, effect for absorbing vibration can be expected. By disposing fixing member 22 at out side of narrow width portion 24, influence of vibration to joint with resistor body 13 can be further decreased. Then, generation of error voltage is prevented, and current can be measured with high accuracy and high reliability, as well as above embodiments.

Although embodiments of the invention have been explained, however the invention is not limited to above embodiments, and various changes and modifications may be made within scope of the technical concept of the invention.

INDUSTRIAL APPLICABILITY

The invention can be suitably used for current detection devices configured as a bus bar, which measures current with high accuracy and high reliability.

The invention claimed is:

1. A shunt type current detection device comprising:
 a first wiring member and a second wiring member those consisting of a conductive metal material;
 a resistor body consisting of a metal material having a lower temperature coefficient of resistance than those wiring members and the resistor body joined between the first wiring member and the second wiring member;
 a plurality of connection portions for making a connection to another wiring member or device formed respectively in the first wiring member and in the second wiring member; and
 a fixing member formed between any one of the plurality of connection portions formed in the first and second wiring members and a joint with the resistor body,
 wherein a bent portion is formed in horizontal direction between one of the plurality of the connection portions and the joint with the resistor body of the first wiring member, and
 wherein the fixing member is formed nearer to the joint with the resistor body than intermediate between the any one of the plurality of connection portion and the joint with the resistor body.

2. The current detection device of claim 1, wherein the fixing member includes a through hole or a recess formed in either the first or second wiring member.

3. The current detection device of claim 1, wherein either the first or second wiring member includes a narrow width portion.

* * * * *